United States Patent [19]

Sherman

[11] Patent Number: 4,563,367
[45] Date of Patent: Jan. 7, 1986

[54] APPARATUS AND METHOD FOR HIGH RATE DEPOSITION AND ETCHING

[75] Inventor: Arthur Sherman, Palo Alto, Calif.

[73] Assignee: Applied Materials, Inc., Santa Clara, Calif.

[21] Appl. No.: 614,944

[22] Filed: May 29, 1984

[51] Int. Cl.$^4$ .............................................. B05D 3/06
[52] U.S. Cl. .................................. 427/39; 118/50.1; 156/643
[58] Field of Search .................. 427/38, 39; 118/50.1; 156/643

[56] References Cited

U.S. PATENT DOCUMENTS

| | | | |
|---|---|---|---|
| 4,175,235 | 11/1979 | Niwa et al. | 156/643 |
| 4,434,742 | 3/1984 | Henaff et al. | 427/38 |
| 4,439,463 | 3/1984 | Miller | 427/39 |

OTHER PUBLICATIONS

Matsuo et al., *Japanese Journ. of Phys.*, vol. 22, No. 2, Apr. 1983, pp. L210–L212.
Sarma et al., *Proceedings 6th International Conf. on Chemical Vapor Deposition*, (Electrochem. Soc., New Jersey), pp. 93–106.

Primary Examiner—John H. Newsome
Attorney, Agent, or Firm—Flehr, Hohbach, Test, Albritton & Herbert

[57] ABSTRACT

A system and methods for very high rate deposition and etching using a separate, substantially enclosed plasma generation chamber within a conventional semiconductor-processing vacuum chamber. A pressure differential is established between the chambers and a low frequency, high flux density, highly dissociated plasma is generated within the smaller internal chamber and projected by the pressure differential to a selected region of the processing chamber. The gas composition, flow rates, power and pressure are readily tailored to the particular etching or deposition process. In addition, the small internal chamber can be rotated and translated to expand the area of coverage. Etch rates of up to 60,000 angstroms per minute and useful quality dielectric film deposition rates of up to approximately 6,000 angstroms per minute have been achieved to date.

14 Claims, 10 Drawing Figures

APPARATUS AND METHOD FOR HIGH RATE DEPOSITION AND ETCHING

BACKGROUND OF THE INVENTION

The present invention relates to plasma-assisted chemical vapor deposition reactors and techniques. In one aspect, the invention relates to reactors and methods for performing high rate plasma-assisted etching. In another aspect, the invention relates to reactors and methods for performing high rate plasma-assisted chemical vapor deposition. Particular applications of the invention include cleaning (and self-cleaning) of reactors and chambers; depositing films on wafers; and cleaning/etching of wafers.

Chemical vapor deposition (CVD) of a solid on a surface involves a heterogeneous surface reaction of gaseous species that adsorb onto the surface. The rate of film growth and the film quality depend on the surface temperature and on the gaseous species available. Some films can be deposited at relatively low surface (substrate) temperatures. One example is CVD silicon dioxide, which is deposited at temperatures of about 400°–600° C. However, some other films, such as silicon nitride, have required much higher temperatures. In certain applications, such temperatures are prohibitive.

Perhaps the classic example of the limitations of high temperature chemical vapor deposition involves the use of CVD films for the final passivation layer of integrated circuits. If no passivating film is used, a relatively high cost, hermetically sealed, ceramic IC package is required. Silicon nitride is the most effective passivating film and would permit the use of low cost plastic encapsulation as an alternative to ceramic IC packaging. Unfortunately, the CVD formation of silicon nitride passivation films require substrate temperatures of approximately 800°–900° C. Because the aluminum metallization used in integrated circuits melts at 600° C., CVD silicon nitride could not be used as the final passivating film. However, the application of plasma techniques to assist silicon nitride CVD deposition lowered the required substrate processing temperatures to about 300°–350° C. This made possible the use of silicon nitride as the final passivation film and, thus, made possible high quality plastic IC encapsulation.

More recently, plasma-enhanced low temperature deposition techniques have been used to form other dielectric films such as silicon dioxide interlayer films. The technique may be applicable to the deposition of diverse materials such as aluminum, silicon, iron oxide, refractory metals such as tungsten, and refractory metal silicides.

The plasma used in all of the commercial plasma-assisted CVD reactors is a low pressure, reactant gas discharge developed in an RF field. A plasma is, by definition, an electrically neutral ionized gas in which there are equal densities of electrons and ions. At the low pressures used in plasma-assisted CVD, typically 50 to 1,000 millitorr, the discharge is in the "glow" region and the electron energies can be quite high relative to the heavy particle energies ($T_E \simeq 20{,}000°$–$30{,}000°$ K.). However, charge neutrality is violated and a plasma "sheath" develops in the region of any physical surface bounding the plasma. Such a sheath develops along electrode surfaces. Ions are accelerated within the plasma across the sheath to the electrode surface. The very high electron temperatures create many dissociated species that can recombine on nearby surfaces (such as substrates), allowing a CVD film to grow. This supplying of reactive free radicals and plasma ion bombardment of the film makes possible low-temperature, silicon nitride chemical vapor deposition, and is critical in general to plasma-assisted chemical vapor deposition.

Using plasma-assisted chemical vapor deposition, silicon nitride is formed from silane, nitrogen and ammonia reactants as follows:

$$SiH_4 + NH_3 + N_2 \rightarrow Si_yN_yH_z \qquad (1)$$

The concentration of hydrogen in the deposited silicon nitride may be as high as 35 atomic percent. For final passivation films, the presence of hydrogen probably does not create problems. However, hydrogen diffusion during high temperature fabrication steps can cause non-uniform electrical characteristics in some existing structural features and components.

There are currently available two types of commercially useful plasma deposition reactors. Referring to FIGS. 1–2, these are, respectively, the hot wall barrel reactor 10 and the radial flow reactor 20.

Figure 1A:
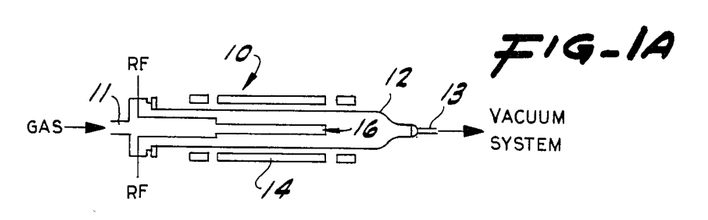
FIGS. 1 and 2 are schematic representations of prior art, plasma-assisted chemical vapor deposition reactors.
Figure 1B:
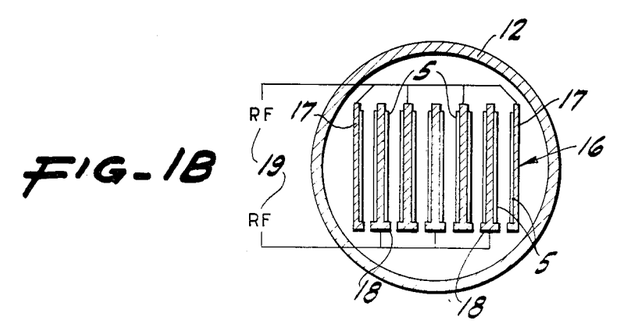
Figure 2:
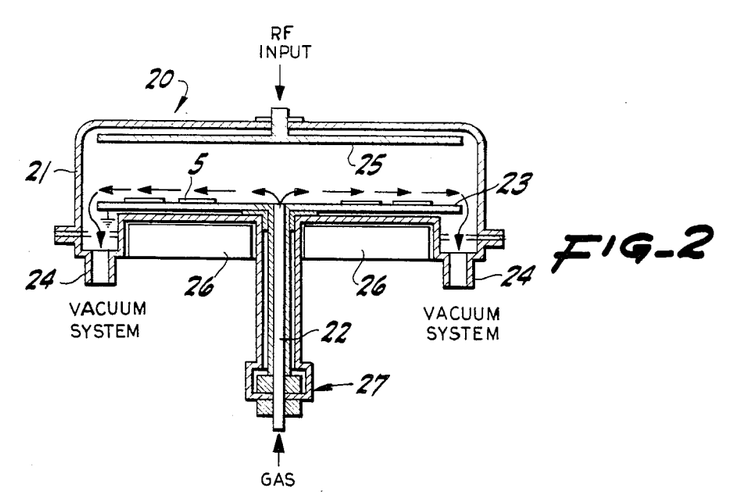

An example of a hot wall plasma-assisted reactor is shown in FIGS. 1A and 1B. The reactor 10 illustrated schematically in FIG. 1A employs an inlet or inlet manifold 11 to supply gas or a mixture of gases to one end of the furnace tube 12, and a vacuum/exhaust outlet 13 at the opposite end which is connected to a vacuum pump (not shown). Deposition is accomplished by a combination of heat provided by electric resistance coils 14 and of reactive species provided locally to the substrates 5—5 by a system 16 of parallel, RF electrodes 17 and 18. The reactor 12 fits into the bore of a diffusion furnace. The electrodes 17 and 18 of system 16 are rectangular and run essentially the length of the furnace tube 12. Alternate electrodes 17 and 18 are connected to the power lead of RF generator 19 and to ground. As the gas mixture flows across the pressure gradient down the length of the tube 12, the electrodes 17 and 18 apply the plasma-generating RF field of 400–500 kilohertz substantially perpendicular to the surface of the substrates. This provides relatively efficient, plasma-assisted deposition of the gaseous species on the heated substrates 5—5.

FIG. 2 schematically illustrates a radial-flow, plasma-assisted CVD reactor 20 which is commercially available from Applied Materials Corporation of Santa Clara, Calif. In one embodiment, the unreacted gases enter the pancake-shaped chamber 21 through an inlet shaft 22 which opens through the center of lower platen or electrode 23. The gas flows radially across the electrode 23 and substrates 5—5 and exits the chamber at outlets 24—24 located at the chamber periphery. The platen 23 is grounded.

RF power is applied to an upper electrode 25 to create a low frequency, 50 kilohertz RF discharge in the gas flow. A magnetic-coupling rotation drive system 27 is provided for rotating the lower electrode/platen 23 to promote uniform deposition. In this system 20, the electrodes 23 and 25 are spaced apart approximately two inches and are approximately twenty-six inches in diameter. This provides a uniform glow discharge and further promotes uniform deposition. In addition, the platen 23 is heated by the heater blocks 26—26 to temperatures of approximately 300° C. to promote recombination and deposition on the substrates. This relatively high temperature reduces hydrogen content (see equation (1), above) and eliminates film cracking. The system 20 is designed for reactor cleaning, controlled wafer etching, and in-situ wafer precleaning and deposition in the same reactor. Specifically, regarding deposition, the radial reactor 20 can deposit silicon nitride, silicon dioxide or amorphous silicon films using a low pressure (200–300 millitorr), low frequency (50 kHz), RF-generated plasma. Examples of applications include oxide for bubble memory interlayers, nitride for GaAs device fabrication, nitride and amorphous silicon nitride for solar cell bulk material and anti-reflective coatings, and numerous nitride passivation applications.

The above-described features of the reactor 20 provide excellent film uniformity and quality at deposition rates of 300–400 angstroms per minute, and provide in-situ wafer cleaning rates of about 1000 angstroms per minute.

Each of the above-described reactors and in general, every deposition chamber forms deposits on internal surfaces including the walls and electrodes during deposition. These surfaces must be cleaned after a number of deposition cycles. Typically this "etch back" is done by disassembling the chamber and immersing the chamber in a wet chemical etchant bath. As is well known in the art, this etch back is time consuming and detracts from production throughput in that the chamber must be disassembled, etched and reassembled. Also, the process is awkward and may produce yield-decreasing particulates and contaminants.

Presumably, each of the reactor systems shown in FIGS. 1 and 2 has the potential for self-cleaning using the system plasma electrodes or coils to generate an etching plasma. In particular, the discovery which led to the present invention resulted from deficiencies in the plasma cleaning of radial flow reactors of the type shown in FIG. 2. For the particular dimensions of reactor chamber 20, a relatively high, uniform cleaning rate of 1,000 angstroms per minute is possible using the system electrodes 23 and 25 to apply RF power of approximately 60 kilohertz to generate an etching plasma from $CF_4$ and $O_2$ flowing at 800 sccm and 160 sccm, respectively. Etchback is required after about every three to five one-micron deposition cycles to remove the resulting three to five microns of unwanted film deposits and restore throughput and yield capability. This plasma dry etch is less awkward, is safer and uses less time than wet chemical etching. Nonetheless, the time required to dry etch (to introduce and stabilize the gases, pump down and etch) can still reduce system hourly throughput by as much as 50 percent.

In addition, plasma self-etching of such reactors may be effective for only a few cleaning cycles in restoring deposition throughput and yield capability. After several plasma cleaning cycles system uniformity goes out of spec, and it is then necessary to use a wet chemical etchback. In addition, if RF power is increased during plasma etching in an attempt to increase the plasma etch rates, wet cleaning is necessary even more frequently.

Thus, the current state-of-the-art of plasa-assisted CVD reactors can be summarized as follows. First, plasma-assisted CVD reactors in general provide maximum processing rates of 300 to 400 angstroms per minute for deposition and 1000 angstroms per minute for etching. These relatively slow etch and deposition rates are offset by the availability of excellent film quality and relatively high throughput using batch processing.

Secondly, plasma self-cleaning of such reactors, while preferred to wet chemical etching, is generally a relatively slow process. As discussed above, increasing power to increase self-etch rates may actually decrease already low throughput.

Thirdly, the use of plasma techniques to clean reactors does not necessarily eliminate the use of wet chemical etching, for wet chemical cleaning may still be required to supplement plasma etching.

SUMMARY OF THE INVENTION

Objects of the Invention

In view of the above-described state-of-the-art, it is an object of the present invention to provide apparatus and methods for efficiently cleaning the interior of chambers used for processing semiconductor wafers.

It is another object of the present invention to provide apparatus and methods for efficiently etching articles, such as semiconductor wafers, within such processing chamber.

It is another object of the present invention to provide apparatus and methods for effciently depositing dielectric films on substrates such as semiconductor wafers.

It is yet another object of the present invention to provide apparatus and methods adapted to existing semiconductor wafer processing chambers for providing very high rate etching (self-cleaning) of the chambers.

It is yet another object of the present invention to provide apparatus and methods for very high rate etching of conductive and dielectric films.

It is yet another object of the present invention to provide apparatus and methods for very high rate deposition of conductive and dielectric films.

It is still another object of the present invention to provide apparatus adapted to a deposition chamber and which is useful both for etching substrates or wafers within the chamber and/or the chamber itself and/or for deposition of dielectric films on substrates or wafers.

Summary

In one aspect, the present invention relates to apparatus for etching or depositing conductive and dielectric films within a semiconductor processing chamber using a second, auxiliary chamber to generate the etching or deposition species. The processing chamber includes vacuum apparatus for maintaining that chamber at subatmospheric pressure. The auxiliary chamber is a relatively small, substantially enclosed chamber which is positioned within the processing chamber. The auxiliary chamber has an inlet for receiving etching or deposition gases and an electrode therein for generating a relatively low frequency, highly dissociated, high density high energy RF discharge of the etching or deposition gas. The auxiliary chamber has at least one orifice of selected dimension and location for directing the reactive species to a selected region of the processing chamber as the result of the pressure differential between the two chambers, i.e., the relatively lower pressure in the processing chamber. Exemplary applications of the apparatus of the present invention include chamber self-cleaning; cleaning/etching of IC wafers; and depositing films or layers.

In one embodiment, the orifice is configured to direct the plasma to a radial sector of the processing chamber and the auxiliary chamber is rotated to enlarge the radial sector.

In another embodiment, the orifice is configured to direct the plasma substantially axially along the processing chamber.

As applied to a cylindrical processing chamber such as a furnace tube, the auxiliary chamber can be rotated about an axis substantially parallel to the cylinder axis and displaced along a path substantially parallel to the cylinder axis to provide etching coverage of substantially the entire processing chamber.

According to another aspect of the invention, a method for etching dielectric films such as silicon nitride and silicon oxide comprises forming a substantially enclosed auxiliary chamber within the processing chamber, applying etching gas such as $NF_3$ to the interior of the auxiliary chamber while maintaining the processing chamber at subatmospheric pressure and applying RF power to the enclosed auxiliary chamber to generate a high energy, low frequency, high density, highly dissociated RF discharge; and thereby transporting the reactive species via an orifice(s) in the auxiliary chamber to a selected region of the processing chamber. In other aspects of the method, the auxiliary chamber is rotated or translated, or both, to increase the area of coverage and to increase the film uniformity. The method is applicable to cleaning or etching the chamber itself (e.g., the walls and electrodes thereof) or to cleaning or etching semiconductor wafers or films thereon.

Presently preferred etching parameters for a 70 cc volume, cylindrical auxiliary chamber include an $NF_3$ etching gas flow rate of 1 to 6 slm, a processing chamber pressure of 200 millitorr to 1 torr, and RF power of 300 watts to 2 kilowatts. In presently preferred optimun values for such chamber, the $NF_3$ flow is approximately 4 slm, the processing chamber pressure is approximately 500 millitorr and the RF power is approximately 700 watts.

In still another aspect, the present invention relates to a method for depositing dielectric films such as silicon nitride by forming a substantially enclosed auxiliary chamber within the processing chamber, applying gas such as silane and ammonia typically in a carrier gas such as nitrogen to the interior of the enclosed chamber while maintaining the processing chamber at subatmospheric pressure and applying RF power internally to the enclosed auxiliary chamber to generate a low frequency, high density, high energy, highly dissociated RF deposition discharge within the auxiliary chamber; and transporting the reactive species through an orifice(s) in the auxiliary chamber to a selected region of the processing chamber. Here, also, the auxiliary chamber can be rotated or translated or both, to widen the area of the coverage and increase the uniformity.

Presently preferred deposition parameters for a 70 cc volume, cylindrical auxiliary chamber are 200 to 1000 millitorr pressure, approximately 200 to 500 watts power, flow rates of approximately 50 to 85 sccm ammonia and 20 to 30 sccm silane, and nitrogen carrier gas flow of 1100 to 1500 sccm.

DETAILED DESCRIPTION

The present invention resulted from discoveries made during attempts to clean plasma-assisted CVD reactors without using wet chemical etchants. As alluded to previously, after several plasma cleaning sequences, reactor system performance may degrade to the point that non-uniform depositions on wafers require wet chemical cleaning of the system. Investigation of possible causes of this performance degradation led to the discovery that aluminum trifluoride crystals ($AlF_3$) were being formed on the bare aluminum upper electrode 25 of reactor system 20 (FIG. 2) during standard plasma self-cleaning. One theory of causation was that the deposits resulted from ion bombardment by active fluorine species in the high RF field which was applied between the electrodes during the plasma self-cleaning process. It was theorized that the fluorine destroyed the natural oxide protective coating on the aluminum and that $AlF_3$ deposits formed during this and subsequent plasma self-cleaning cycles.

Figure 4:
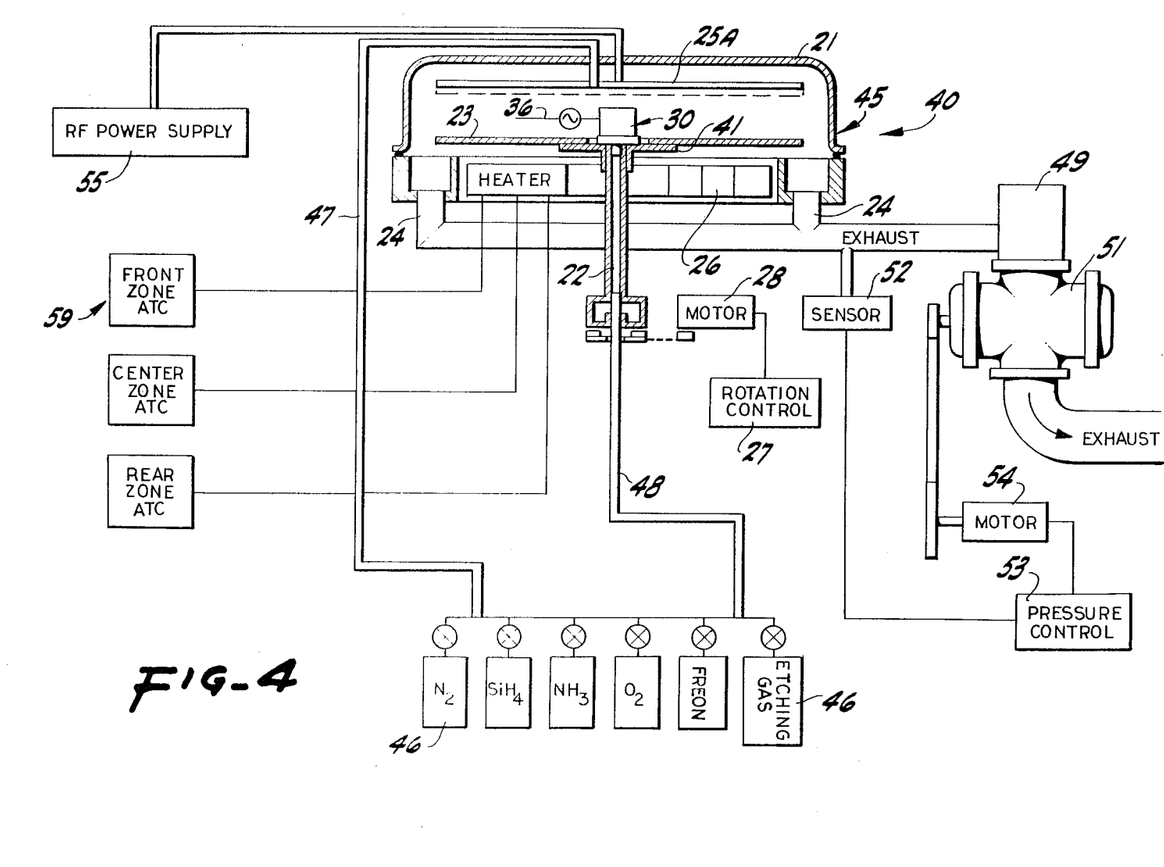
FIG. 4 is a schematic representation of a plasma-assisted CVD reactor system which incorporates high rate etch cleaning capability in accordance with the present invention.

To test this theory, the reactor 20 of FIG. 2 was modified to receive a separate, substantially enclosed, internal plasma generator chamber or reactor 30 (see reactor 40, FIG. 4). The reactor or inner chamber 30 forms a high concentration of active chemical species and projects the species onto surfaces within the reactor 40 without ion bombardment of the electrodes 23 and 25. The apparatus and technique worked in providing non-destructive plasma etching (cleaning) of reactor 40. Use of this apparatus also led to additional discoveries. First, the etching is at very high rates, approximately five times conventional plasma etching rates. This capability of high power density and very high etch rates is in distinct contrast to the prior practice in which attainable power density levels were relatively low and attempts to increase power and etching served primarily to increase the frequency of wet chemical cleaning. This high rate etch capability is applicable to IC wafer cleaning or etching as well as to reactor cleaning. Secondly, it was discovered that the reactor 30 could be used for plasma-assisted chemical vapor deposition and that the deposition rates are approximately an order of magnitude greater than conventional plasma-assisted CVD deposition rates.

Figure 3A:
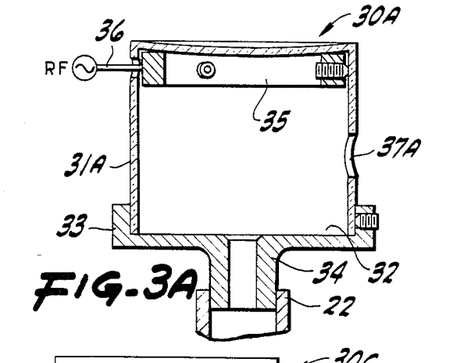
FIGS. 3A through 3C illustrate alternative configurations of the internal, plasma generator chamber which is used in systems such as those shown in FIGS. 4, 5, 6 and 7.
Figure 3B:
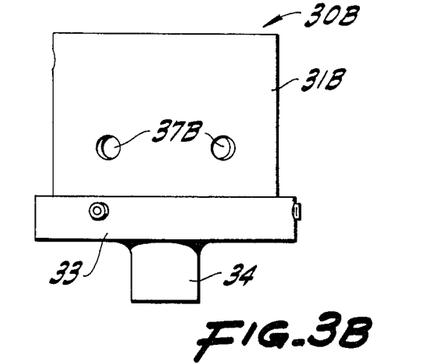
Figures 3C, 6:
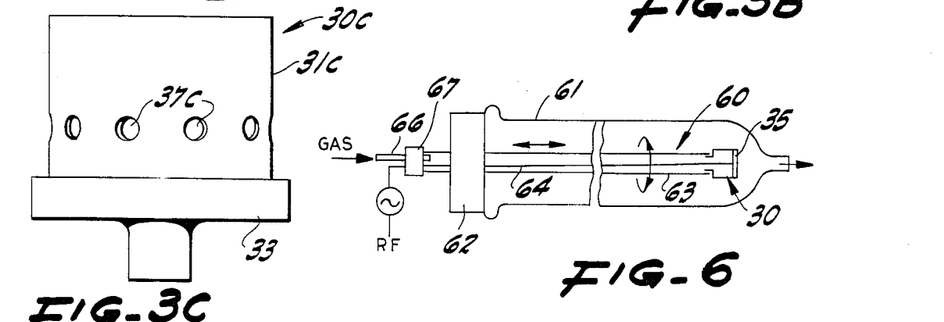
FIG. 6 illustrates application of the present invention to a system for cleaning furnace tubes.

Three embodiments 30A, 30B and 30C of the plasma generator chamber are shown respectively in FIGS. 3A, 3B and 3C. Each chamber includes a cylindrical crucible 31, typically of ceramic material such as aluminum oxide. Crucible 31 is open at the bottom end 32 thereof. A conductive flanged electrode or seat 33 of material such as nickel completes the enclosure of the crucible 31 and supports the crucible, for example, within the upper end of the gas inlet shaft 22 of system 40. The seat 33 has a stem 34 which fits into the inlet shaft 22 for receiving inlet gases and releasably attaching the crucible to the inlet shaft 22. The reactor 30 also includes an annular RF electrode 35 which is mounted within the crucible 31. The electrode 35 is connected via power lead 36 to a source of RF power. With this arrangement, gas enters the crucible 31 via inlet shaft 22, is formed into an RF glow discharge there, and the resulting reactive species are projected from the chamber 30 via the aperture(s) or window(s) 37 formed in the crucible wall 31.

The windows 37 may take various forms. For example, crucible 31A (FIG. 3A) has a single circular window 37A. Crucible 31B (FIG. 3B) has a pair of windows 37B—37B. Crucible 31C (FIG. 3C) has a plurality of windows 37C spaced at approximately equal intervals about its periphery. Other configurations and types of windows 37 can be used, including slot configurations and essentially continuous openings about the crucible periphery.

Returning to FIG. 4, system 40 comprises a radial flow process reactor 45 which is adapted to utilize the plasma generator chamber 30. In an exemplary working embodiment, the reactor 45 is the previously-mentioned modification of the commerical system 20 of FIG. 2. Accordingly, components of system 40 which correspond to those of reactor 20 shown in FIG. 2 are given like numerical designations here. In addition, it should be mentioned that reactor 45 can employ a commerically available electrode-manifold assembly 25A which comprises both an RF electrode and a gas inlet manifold. The gas manifold section of the assembly is connected, as by line 47, to the deposition gas supply system and line 48 brings in the etching gas such as freon. The use of the electrode-manifold assembly 25A allows the inlet shaft 22 and the rotational system 27 to be dedicated to the reactor 30.

Referring further to FIG. 4, the reactor system 40 includes chamber 21, typically comprising metallic or ceramic walls, and a platen or electrode 23 which is grounded during plasma operation, and is substantially parallel to upper electrode-manifold assembly 25A. Gas of suitable composition for etching is provided to the interior of the chamber via inlet shaft 22 from the gas supply system. This system includes a number of gas storage tanks or reservoirs 46—46 which supply deposition as to line 47. Gas flow for deposition is then via the line 47, through electrode-manifold assembly 25A and into the chamber 21. Outward-directed radial gas flow is provided within the chamber 21 by a vacuum system which includes exhaust outlets 24 at the periphery of the base of the reactor 45. These outlets are connected to a mechanical pump (not shown) via a vacuum valve 49 and Roots blower 51. Control of system vacuum is provided via a capacitance manometer sensor 52 which operates through a pressure control system 53 and DC motor 54 to control the speed of the blower. Plasma deposition operation is provided by an RF system 55 which includes an RF power supply and load matching network connected to the aluminum electrode 25 or 25A. A separate RF power supply (not shown) is used to provide RF power via lead 36 to the auxiliary reactor 30 used for plasma etching. Typically, wafers are supported on the platen 23, and are heated by the three-zone heater blocks 26—26 under the control of an automatic temperature control system 59.

Figure 5:
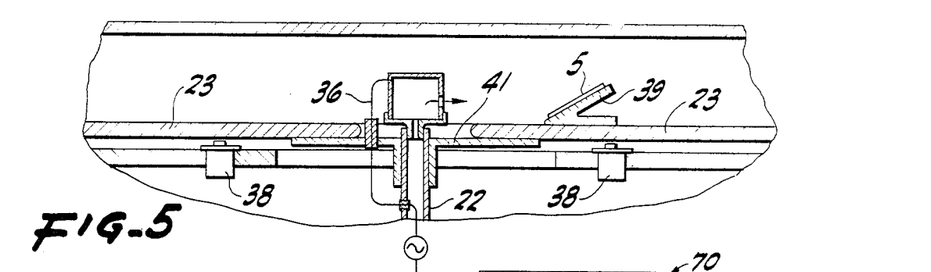
FIG. 5 is a slightly enlarged, partial schematic cross-sectional view of the reactor system shown in FIG. 4, illustrating a rotational configuration thereof.

As further shown in FIG. 4, auxiliary plasma generator chamber 30 fits into the internal bore of the inlet shaft 22 and rests on the shoulder or flange 41 thereof. The plasma generator chamber 30 can be rotated to increase the uniformity of etching/deposition coverage and/or to increase the area of coverage. One presently preferred approach is shown schematically in FIG. 5. The RF power lead 36 is routed through the gas inlet shaft 22. Solenoids 38—38 are mounted beneath the platen, for example by attaching them to the heater block assemblies 26—26. The solenoids are activated prior to high rate etching so that their armatures raise the platen 23 off the flange or shoulder 41 of the inlet shaft to decouple the platen from rotating with the shaft. Using this approach, the platen remains stationary when the chamber 30 is rotated by motor 28 (FIG. 4).

Figure 7:
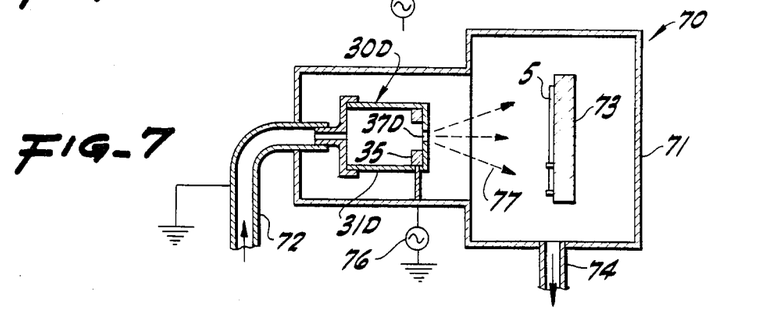
FIG. 7 illustrates applications of the present invention to a system for depositing (or etching) conductive or dielectric films.

FIGS. 6 and 7 illustrate two additional examples of processing systems which incorporate plasma generating chambers 30 for the purpose of etching, or of depositing films. As shown in FIG. 6, the reactor chamber 30 (i.e., chamber 30A, 30B or 30C) is part of a cleaning system 60 which during plasma cleaning operations is inserted into a standard furnace tube 61 in the furnace bore (not shown). The assembly 60 includes a vacuum seal-drive assembly 62 which is inserted into the inlet end of the furnace tube. The reactor 30 is mounted on a threaded shaft 63 which extends through the vacuum seal-drive assembly 62. The assembly 62 includes a motor (not shown) which rotates the shaft 63 to advance the shaft and the attached chamber 30 along the axis of the furnace tube 61 and in so doing rotates the chamber about the axis. RF power is applied by a power lead 64 which extends through the interior of the shafft 63 into the chamber 30. Similarly, gas is supplied by inlet tube 66 through the shaft 63 to the chamber 30. Preferably, the RF lead 64 and gas inlet 66 enter the shaft via a rotating seal 67 which holds the power lead 64 and gas inlet tube 66 stationary during rotation of the shaft 63. Power lead 64 is attached to the annular RF electrode 35, for example, by a slip ring (not shown) which provides electrical contact to the electrode, and permits the electrode to rotate without rotating the power lead.

In operation, the chamber assembly 60 is fitted to the inlet end of the tube 61. A cleaning plasma is generated by the application of etching gas and RF power, and the furnace tube interior is cleaned by actuating the motor drive to both rotate the chamber 30 and advance the chamber along the tube.

In another example of the use of the plasma generating chamber 30, the chamber is part of a plasma-assisted chemical vapor deposition system 70 shown in FIG. 7. The system 70 includes a chamber 71 which has an outwardly stepped configuration (in the direction from the inlet end to the exhaust end). The chamber 71 includes a platen 73 which supports a semiconductor wafer 5 thereon as by clips or springs. Alternatively, the wafer 5 may be positioned within a recess formed in the platen. Also, the chamber dimensions can be increased to provide for the processing of more than a single wafer at a time. The plasma generation chamber 30D is similar to the other embodiments (30A through 30C) except that the window 37D is formed in the end of the chamber, rather in the side walls thereof. With this arrangement, the deposition gas flows through inlet shaft 72 into the crucible 31D; plasma is created in the chamber crucible by the application of RF power from source 76 to the electrode 35; then the resulting focused, dense flux 77 of dissociated radicals are transported at high velocity through the window 37D and onto the substrate 5. Gas is removed from the chamber by a vacuum pump system (not shown) via outlet 74.

Those skilled in the art will readily derive other systems which use the chamber 30, including other versions of the systems 40, 60 and 70. For example, the chamber 30 could be mounted externally at the viewing port used in reactor 45 and scanned across the interior of the reactor using a reciprocating pivotal scanning motion.

The auxiliary plasma chamber 30 generates higher power densities than conventional reactors in such a way that these high levels are attained without damaging the electrodes of the processing reactor such as reactor 45. Key aspects of the invention include the ability to generate a dense concentration of highly dissociated, active species by applying very high RF power densities to the substantially enclosed, relatively small chamber 30; (2) "freezing" the free radicals by expansion at the window 37; and (3) using the relatively low sub-atmospheric exhaust pressure of the processing chamber (21, 61 or 71) and the pressure differential between the processing chamber and the plasma generation chamber 30 to transport a focused, dense flux of the dissociated radicals at a high velocity into the processing chamber. Recombination of electrons and ions is completed quickly, perhaps within one microsecond. Dissociated species recombine more slowly, i.e., one millisecond. The rapid expansion at the window 37 causes the reactive dissociated species to remain highly dissociated until they can transmit the reactor. Thus, for example, high-velocity fluorine and fluorine-based free radicals do not have time to recombine in the body of gas. Rather, recombination does not occur until the species reach the surfaces which are to be etched or coated. The high density, high energy stream of reactive species enhances etch/deposition rates at the etched/deposited surface.

The above described capability and operation were demonstrated for both etching and deposition applications. Two different sized reactors 30 were used. The first had a 1⅞ in. inside diameter and a 1½ in. inside height, which provided approximately a 70 cc generating volume. The second reactor size was 1½ in. inside diameter by 1½ in. inside height and provided approximately 45 cc of internal volume. The deposition system 40 shown schematically in FIG. 4 was used for both the etching and the deposition applications discussed below.

ETCHING

The system 40 was used to etch silicon nitride dielectric films off of the interior walls of chamber 21 of the reactor, and off of the electrode-manifold assembly 25A and platen 23. Specifically, the generator chamber 30 was used to create a discharge of ionized fluorine-bearing gas. The resulting reactive species (F, NF, $NF_2$, etc.) are capable of cleaning the reactor 45 after deposition.

The self-cleaning of silicon nitride deposits from reactor 45 was attempted initially using the 45 cc reactor 30 and crucible window configuration 37C (FIG. 3C). The ten windows in 37C were each one cm in diameter and spanned approximately 360° of the crucible periphery. The discharge created at 80 kilohertz, 220 watts, and 250 millitorr using 850 sccm $NF_3$ cleaned the chamber walls and electrodes at the rate of 3,000 angstroms per minute. The discharge cleanly etched an eight-inch diameter circular section of the top and bottom walls of reactor 45, including the electrodes 23 and 25A. This eight-inch diameter coverage would be more than sufficient to clean the end walls and side walls of a standard 5–10 inch diameter furnace tube using the cleaning system 60 of FIG. 6.

In addition to the above-described self-cleaning sequences, fifty-two groups of silicon nitride-covered 2–4 inch diameter wafers were etched, typically two or three wafers to a group. The 70 cc crucibles and window configurations 37A and 37B were used. Twenty-nine of the wafer groups were processed using crucibles 31A having a single three-eighths inch window 37A and using two wafers positioned on the same radial axis. In addition, fifteen groups were processed using crucibles 31B having a pair of three-eighths inch windows 37B which were spaced approximately one-half inch apart, and using three wafers. The three wafers in each group were placed adjacent the reactor window(s) (a single wafer was positioned nearest the reactor and the other two were spaced approximately equidistant from the first). Typically, the silicon nitride film thickness was measured before and after an approximately 30 second or one minute etch sequence and the difference was used to calculate the etch rate in angstroms per minute.

The following ranges of parameters were used:
Power (chamber 70): 300–900 watts
Pressure (chamber 55): 200–1000 millitorr
$NF_3$ flow rate: 1–6 slm The resulting etch rates varied from 10,000 angstroms per minute to 60,000 angstroms per minute. Even the lowest rate, 10,000 angstroms per minute, is approximately five to ten times greater than the rates of 1,000 to 2,000 angstroms per minute which are attainable using dedicated single wafer plasma etchers, and is ten times greater than the 1,000 angstroms per minute self-cleaning rate which is possible using conventional plasma CVD reactors.

Two things were quite evident in analyzing the data. For most of the etch groups, the etch rate decreased with increasing radial distance from the window 37. However, and particularly at higher power and pressure levels, quite uniform etch rates were attainable along the radius intersecting the window(s) midpoint.

Those skilled in the art will understand that for any combination of outer and inner chambers, including exemplary chambers 45 and 30, there are practical limits to the mass flow that can be pumped at a particular exhaust pressure. Thus, relatively higher pressure is generally desirable because it will sustain higher mass flow rates. However, lower pressure is also beneficial to the extent that it provides a longer lifetime for the dissociated species. As a consequences of such conflicting requirements, and although all fifty-two sample groups were etched cleanly at very high rates, it is felt that an optimum combination of parameters for the 70 cc chamber 30, and the single one-eighth inch diameter window, configuration 37A, was about 4 slm $NH_3$, 500 millitorr exhaust pressure, and 700 watts RF power. This particular combination is considered optimum because it provided an excellent combination of high etch rates (40,000 angstroms per minute) and radial uniformity. Higher exhaust pressure decreases the efficiency of the discharge behavior, as evidenced by radial fall off of etch rates.

In view of the above explanations and examples, it is believed one of skill in the art will readily determine satisfactory and, indeed, optimum etching conditions for etching (and deposition—see discussion below) for essentially any reactor chamber and system. In addition, many different etching gases and etching gas mixtures should be applicable, including but not limited to other fluorine-containing gases such as $CF_4$, $SF_6$, $CHF_3$ and $C_2F_6$, and mixtures or combinations of oxygen and fluorine-containing gases.

As an example of the advantages of using the system 40 with self-cleaning, assume conservatively that the system has the capability to self-clean at a rate of approximately 5,000 angstroms per minute and that cleaning is necessary approximately every five deposition runs to clean a wall deposit thickness of about five microns. Using system 40, the time required to clear the chamber 45 is about 10 minutes for etching. In contrast, conventional plasma self-cleaning techniques require approximately 50 minutes to clear the reactor (assuming a maximum etch rate of about 1,000 angstroms per minute). In an eight hour shift it is possible to run approximately 10 one-micron deposition cycles (30 minutes for each deposition plus about 15 minutes for pumping, filling, purging, etc.). Thus, use of the present system 40 saves nearly two hours per shift and increases the throughput by nearly two cycles per shift, assuming a cleaning frequency of once every five deposition runs. Of course, if it is necessary to clean more frequently, time savings would increase proportionately.

DEPOSITION

An experimental program was established to study the chamber 30 in a deposition system. System 40, FIG. 4, was used. The 70 cc version of chamber 30A was used to individually deposit silicon nitride films on two-inch and three-inch diameter silicon wafers. The crucible 31A had one window 37A which was three-eighths of an inch in diameter. Deposition was performed using nineteen different sets of the parameters power, pressure and gas flow. The following parameter ranges were investigated:
Power (chamber 30): 200–500 watts
Pressure (chamber 45): 200–1000 millitorr
Gas flow rates:
$SiH_4$—22–30 sccm
$NH_3$—0–85 sccm
$N_2$—1125–1500 sccm
Wafer size: 2 in. and 3 in.
Wafer temperature: 230°–350° C.
Wafer mounting angle: 30°

The individual wafers and their corresponding sets of parameters are identified and summarized in Table 1 as numbers 1–19 and as groups 1–7. Within each group typically a single parameter was varied to determine its effect. Throughout, RF power of 60 kilohertz was used. A single silicon wafer 5 was used for each run and was supported within processing chamber 21 on a 30° angled aluminum holder 39. (For convenience, holder 39 is shown in the FIG. 5, enlarged rotational version of chamber 45.) The holder itself sat either on platen 23 (samples 1–11) or directly on the heater block 26 (samples 12–19). Three-inch wafers were used for run numbers 1–11. For samples 12–19, two-inch wafers were used, the electrode-manifold assembly 25A and platen 23 were removed and the wafer holder 39 was placed directly on the heater block 26, to increase the spacing between the wafer and the chamber surfaces, minimize interaction effects and permit higher wafer temperatures. The wafer temperatures were approximately 230° C. (samples 1–11) and approximately 330°–350° C. (samples 12–19).

Measurements of film thickness were made using a Nanospec ® Interferometer. Film thickness was then used to obtain the deposition rates. The films were wet etched in buffered hydrogen fluoride (BHF) etching solution (13:2 $NH_4$:HF) at 25° C. in order to provide an indirect estimate of film density and quality. A relatively low BHF etch rate of approximately 300 angstroms per minute for silicon nitride is generally considered to be indicative of a relatively high quality, dense film. An indication of the stoichiometry of the silicon nitride film was obtained by measuring the refractive index using an Ellipsometer. The ranges of the results obtained were:
Deposition rate: 2158–6582 Å/minute
Wet etch rate: 272–18,850 Å/minute
Refractive Index: 1.75–2.47

TABLE 1

Silicon Nitride Deposition

| Sample | Group | Rate (sccm) $SiH_4$ | $NH_3$ | $N_2$ | Power (watts) | Pressure (millitorr) | Wafer Temp. (°C.) | Deposition Rate (Å/min.) | Wet Etch Rate* (Å/min.) | Refractive Index |
|---|---|---|---|---|---|---|---|---|---|---|
| 1 | 1 | 30 | — | 1500 | 200 | 350 | ≦230 | 5969 | 18850 | 2.20 |
| 2 | 2 | " | 85 | " | " | " | " | 2473 | 5496 | 1.85 |
| 3 | 2 | " | " | " | 300 | " | " | 3453 | 906 | 1.86 |
| 4 | 2 | " | " | " | 400 | " | " | 4216 | 784 | 1.85 |
| 5 | 2 | " | " | " | 500 | " | " | 4984 | 430 | — |
| 6 | 3 | " | " | " | " | 200 | " | 2866 | 7265 | 1.75 |
| 7 | 3 | " | " | " | " | 350 | " | 4764 | 657 | 1.79 |
| 8 | 3 | " | " | " | " | 500 | " | 5336 | 440 | 1.80 |
| 9 | 4 | " | 68 | " | " | " | " | 5686 | 395 | 1.82 |
| 10 | 4 | " | 51 | " | " | " | " | 6408 | 570 | 1.84 |
| 11 | 5 | " | " | " | " | 350 | " | 5033 | 332 | 1.86 |
| 12 | 6 | " | 68 | " | " | 250 | ≃300–350 | 3506 | 384 | 2.15 |
| 13 | 6 | " | " | " | " | 500 | " | 5056 | 410 | 2.03 |
| 14 | 6 | " | " | " | " | 750 | " | 5616 | 408 | 2.05 |
| 15 | 6 | " | " | " | " | 1000 | " | 6582 | 564 | 2.47 |
| 16 | 7 | 22 | 51 | 1125 | " | 250 | " | 2158 | 272 | 1.91 |
| 17 | 7 | " | " | " | " | 500 | " | 2884 | 370 | 2.00 |
| 18 | 7 | " | " | " | " | 750 | " | 3754 | 259 | 2.00 |
| 19 | 7 | " | " | " | " | 1000 | " | 4280 | 294 | 1.95 |

*Wet etchant was buffered hydrofluoric acid (BHF; 13:2 $NH_4$:HF) at 25° C.

Characterization of the nineteen samples shows a variation in the deposition rate as a result of varying the deposition parameters. Example 1 evidences extraordinarily high deposition rates, nearly 6,000 angstroms per minute, but also very high etch rates which are suggestive of a porous film. The absence of ammonia may have contributed to the low density. In view of the characteristics of the other films, this one film may simply have been anomalous.

Groups 2 and 3 (samples 2-8) show that increasing the power and the chamber pressure increases both the deposition rate and the film density.

Groups 4 and 5 (samples 9, 10 and 11) suggest that decreasing the ammonia flow rate and thus the availability of hydrogen may require controlled decreases in power and/or pressure to maintain density.

Groups 6 and 7 illustrate the effect of sequentially increasing the pressure when the gas flow rates were decreased by 75 percent. While there appears to be no clear-cut trend for etch rates, several things are evident. First, the deposition rate increases for increasing pressure within both groups. Secondly, with the exception of sample 15, stoichiometry is quite good. Thirdly, while the deposition rates associated with the relatively high gas flow rate of Group 6 are relatively higher than those for Group 7, the deposition rates for Group 7 are nonetheless quite high. Finally, the Group 7 films are slightly more dense than Group 6 films. In particular, the parameters used for Group 7, samples 16 and 18, provided outstanding density (272 and 259 Å/minute etch rates), and deposition rates (2158 and 3754 Å/minute) which are about five to ten times the maximum 400 Å/minute rate previously achieved using plasma-assisted CVD reactors.

Quite clearly, Groups 6 and 7 along with the other groups demonstrate that system 40 and chamber 30 provide exceptional deposition rates and high film quality and stoichiometry. These samples clearly establish that extremely high deposition rates are obtained using the apparatus and methods of the present invention without sacrificing density and stoichiometry. Those skilled in the art will readily obtain useful high deposition rates using other reactor chambers, other systems, such as system 70, FIG. 7; other films, and other combinations of gas(es), gas flow rates, power and pressure.

EFFECTS OF PARAMETER VARIATION

As evidenced by the data herein, the power per unit volume of the generation chamber 30 is a key parameter in applying the apparatus and methods of the present invention. The power densities used here were approximately 3-13 watts/cc (200-900 watts; 70 cc chamber 30). The maximum power used here, about 900 watts, was limited by the necessity to avoid thermal stress cracking of the aluminum oxide chamber 30. Various approaches can be used to avoid or decrease thermal stress cracking and permit the use of higher power, including reinforcing the aluminum oxide with ceramic cement and/or using a different high temperature insulating material such as magnesium oxide, quartz, or silicon dioxide.

In general, increasing the power density increases both deposition rate and the etching rate.

Increasing the exhaust pressure tends to increase the mass flow (density) of the reactive species which are available for etching or deposition and, thus, tends to increase the etching rate and the deposition rate.

Increasing the exhaust pressure also tends to increase the flow velocities of the reactive species. This increases the distance over which the projected species can travel and still effectively etch and deposit. The effects of density and velocity are illustrated by the decreased etch distance in the above example which used the ten-window configuration 37C. The effect of so many windows is to decrease the pressure differential between the two chambers 30 and 45. The decreased pressure decreases the flow velocity such that the reactive species recombine at shorter distances. In contrast, in the example which used the single window configuration 37A, the reactive species were projected at sufficient velocity so that efficient etching was done across the 30-inch diameter of the reactor 45.

It should be noted that increasing the pressure has the unwanted effect of increasing collisions and thereby can decrease the lifetime of the reactive species. Of course, this may decrease the distance traveled by such species. However, this decrease in lifetime can be eliminated or at least substantially offset by increasing power along with the pressure. It is thus clear that, within limits, both the etching rate and the deposition rate can be increased by increasing both power and pressure together.

The "limits" involve factors such as the power sustainable by this system, the flow rates of the reactant gases and the acceptable film quality. The important thing is that, unlike prior art processes the generation chamber 30 of the present invention is not only able to withstand relatively high pressure and power, but in fact advantageously uses them to establish a very high density of reactive species which have a relatively long lifetime, and thereby providing either high rate etching or deposition over a large distance and volume.

COMBINED DEPOSITION AND ETCHING/CLEANING SYSTEMS

One key advantage of the present invention is the ability to provide high rate etching (e.g., wafer pre-cleaning, wafer etching or reactor cleaning) by the simple expedient of providing an enclosed, internal plasma generation chamber. A second advantage is the ability to provide high rate deposition. It is believed both of these features are novel. A third novel aspect is the ability to provide, in a properly configured system, for both high rate deposition and high rate etching using the same apparatus and even several of the same parameters. As discussed above, this has been demonstrated for reactor system 40 despite the fact that deposition and etch processes proceed by different mechanisms and usually are done using different techniques. Specifically, the versatility of the present invention has been demonstrated in the data described here, wherein high rate etching of silicon nitride and high rate deposition of silicon nitride have been demonstrated over a common range of parameters using the same reactor system 40.

It is to be emphasized that the primary use of the invention is believed to be to add efficient, high-rate self-cleaning capability to existing reactors, or to provide a high-rate etch system or to provide a high-rate deposition system perhaps with self-cleaning capability. However, those of usual skill in the art will develop reactor configurations within the scope of the present invention which provide both high rate etching of wafers (e.g., etching of dielectric and/or conductive films thereon) and high rate deposition of dielectric and/or conductive films.

I claim:

1. A deposition chamber system adapted for etching dielectric films such as silicon nitride or silicon oxide from the interior walls of the deposition chamber, comprising a first chamber adapted for deposition of semiconductor dielectric films and including vacuum means for maintaining the deposition chamber at subatmospheric exhaust pressure; a second enclosed chamber within the deposition chamber having inlet means for receiving etching gas, and further mounting electrode means therein for generating an RF-discharge etching plasma of the etching gas; the inner chamber also having at least one orifice of selected dimension and location such that the subatmospheric outer chamber pressure and resulting pressure differential between the chambers directs the plasma to a selected region of the outer chamber; means for moving the inner chamber orifice relative to the outer chamber to increase the area of the selected regions; and power supply means for applying RF energy to the electrode means.

2. The deposition chamber system of claim 1 wherein the inner chamber is adapted for selectively receiving deposition gas to thereby generate a deposition gas plasma which is directed to the selected region.

3. Apparatus for depositing at least one of silicon nitride or silicon oxide films on a substrate, comprising a first enclosed outer chamber adapted for holding a substrate at a selected region therein; a second, enclosed inner chamber within the outer chamber having inlet means for receiving deposition gas and further having electrode means therein for generating an RF-discharge deposition plasma of the deposition gas; means communicating with the outer chamber for maintaining subatmospheric pressure therein lower than the resulting pressure in the inner chamber; power supply means for applying RF energy to the electrode means to generate the deposition plasma; the inner chamber having at least one orifice therein of size adapted such that the pressure differential between the outer and inner chambers exhausts the plasma through the orifice to the selected region of the chamber; means for moving the inner chamber orifice relative to the first chamber to increase the area of the selected region; and substrate heating means for maintaining the substrate temperature within the range of about 250° C. to 350° C. during deposition.

4. Apparatus for performing at least one of depositing or etching semiconductor or dielectric films, comprising: a first outer chamber including vacuum means for providing subatmospheric pressure therein; a second substantially enclosed inner chamber having inlet means for receiving gas selected from etching gas and deposition gas compositions and having electrode means mounted therein for generating an RF-discharge etching plasma or deposition plasma of the selected gas, and further having at least one orifice of selected dimension and location for directing the plasma over an angular sector of the chamber as the result of a pressure differential created in the two chambers by the subatmospheric pressure in the outer chamber; and means for rotating the second chamber in a first path to enlarge the sector.

5. The apparatus of claim 4, further comprising means for moving the chamber along a second path to further enlarge the section.

6. The apparatus of claim 5, wherein the chamber is approximately cylindrical in configuration and wherein movement in the first direction is about an axis parallel to the cylinder axis and movement in the second direction is along an axis parallel to the cylinder axis.

7. A method for performing at least one function selected from etching and depositing films on a substrate within a first, vacuum chamber, comprising: providing within the first chamber a second, substantially enclosed chamber having an internal RF electrode, a gas inlet and at least one gas outlet orifice of predetermined size and location; applying subatmospheric pressure to the first chamber; maintaining the first chamber at lower internal pressure than the second chamber; applying RF power to the electrode; supplying gas selected from etching and deposition compositions via the gas inlet means to the interior of the second chamber, to thereby generate a discharge from the gas and transport the resulting reactive species via the outlet orifice to a selected region of the first chamber; and moving the second chamber along at least one path within the first chamber.

8. A method for forming silicon nitride on a substrate within a first chamber, comprising: providing within the first chamber a second, relatively small, substantially enclosed chamber having internal RF electrodes, gas inlet means and gas exit means; applying RF power of approximately 200 to 500 watts to the electrode and establishing a pressure of 200 to 1,000 millitorr in the first chamber, both while supplying silane, ammonia and nitrogen gas via the gas inlet means to the interior of the second chamber; and rotating the second chamber to increase the area of deposition.

9. The method of claim 8 wherein the power is approximately 500 millitorr, and the ammonia, silane and nitrogen flow rates are approximately 50 to 85 sccm, 20 to 30 sccm, and 1,100 to 1,500 sccm, respectively.

10. A method for etching in a first chamber at least one film selected from silicon nitride and silicon oxide films, comprising: providing within the first chamber a second, relatively small, substantially enclosed chamber having RF electrodes, gas inlet means and gas exit means; applying RF power of approximately 300 watts to 2 kilowatts to the electrodes and applying a pressure of 200 millitorr or 1 torr to the first chamber, both while supplying $NF_3$ at a flow rate of approximately 1 to 6 slm via the gas inlet means to the interior of the second chamber; and rotating the second chamber to increase the area of etching.

11. The method of claim 10, wherein the power is 500 to 900 watts, the pressure is 300 to 500 millitorr and the $NF_3$ flow rate is 2 to 6 slm to provide an etch rate of approximately 20,000 to 50,000 angstroms per minute.

12. The method of claim 11, wherein the power is approximately 700 watts, the chamber pressure is approximately 500 millitorr and the $NF_3$ flow rate is approximately 4 slm to provide an etch rate of approximately 40,000 angstroms per minute.

13. The method of claims 8 or 10, further comprising the steps of rotating the second chamber along a first path and translating the second chamber along a second path to increase said area.

14. The method of claims 8 or 10, wherein the first chamber is substantially cylindrical and wherein said area is increased by rotating the second chamber about an axis parallel to the cylinder axis and moving the second chamber along an axis parallel to the cylinder axis.

* * * * *